(12) United States Patent
Hebras (10) Patent No.: US 8,212,249 B2
(45) Date of Patent: Jul. 3, 2012

(54) METHODS OF FORMING A LAYER OF MATERIAL ON A SUBSTRATE AND STRUCTURES FORMED THEREFROM

(75) Inventor: Xavier Hebras, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/535,056

(22) Filed: Aug. 4, 2009

(65) Prior Publication Data

US 2010/0044706 A1    Feb. 25, 2010

Related U.S. Application Data

(62) Division of application No. 11/504,256, filed on Aug. 14, 2006, now Pat. No. 7,585,749.

(30) Foreign Application Priority Data

Mar. 13, 2006  (FR) ...................................... 06 02178

(51) Int. Cl.
    *H01L 29/24* (2006.01)
(52) U.S. Cl. .................................. 257/52; 257/E29.101
(58) Field of Classification Search ........................ None
    See application file for complete search history.

(56) References Cited

U.S. PATENT DOCUMENTS

| 5,298,449 | A  | 3/1994  | Kikuchi ........................ 438/459 |
| 6,468,923 | B1 | 10/2002 | Yonehara et al. ............. 438/761 |
| 6,638,872 | B1 | 10/2003 | Croswell et al. .............. 438/695 |
| 6,696,352 | B1 | 2/2004  | Carr et al. ..................... 438/458 |
| 7,183,177 | B2 | 2/2007  | Al-Bayati et al. ............. 438/458 |
| 2002/0146892 | A1 | 10/2002 | Notsu et al. ................... 438/455 |
| 2004/0005740 | A1 | 1/2004  | Lochtefeld et al. ........... 438/149 |
| 2004/0099890 | A1* | 5/2004 | Umimoto et al. ............. 257/288 |
| 2004/0262686 | A1 | 12/2004 | Shaheen et al. ............... 257/347 |
| 2005/0085055 | A1 | 4/2005  | Tan et al. ...................... 438/481 |
| 2005/0142879 | A1 | 6/2005  | Atwater et al. ............... 438/689 |

FOREIGN PATENT DOCUMENTS

WO    WO 03/049163    *    6/2003

OTHER PUBLICATIONS

E.P. EerNisse, "Investigation of Ion Implantation Damage with Stress Measurements," Ion Implantation in Semiconductors, Ruge, Ingolf (ed.), New York Springer-Verlag New York, Inc., pp. 17-22 (1971).
Search Report, application No. FR 0602178, dated Nov. 21, 2006.
Nishikawa et al., "Elimination of secondary defects in preamorphized Si by C$^+$ implantation," Applied Physics Letters, 62(3):303-305 (1993).

* cited by examiner

*Primary Examiner* — Seahvosh Nikmanesh
(74) *Attorney, Agent, or Firm* — Winston & Strawn LLP (57) ABSTRACT

Various structures that include at least one thin layer of an amorphous material on a supporting substrate. One structure generally has a receiving substrate, a central crystalline layer and an amorphous layer, all of which may lack any end of range point defects. Another structure includes an intermediate substrate having an upper face, an upper portion and a lower portion, an amorphous layer that does not contain end of range point defects, and a first crystalline layer containing end of range point defects subjacent the amorphous layer and located in the lower portion; and a supporting substrate bonded to the upper face of the intermediate substrate. That structure can also contain a weakened zone or porous layer to facilitate removal of the first crystalline layer to provide the amorphous layer as an upper layer of the semiconductor structure.

18 Claims, 6 Drawing Sheets

METHODS OF FORMING A LAYER OF MATERIAL ON A SUBSTRATE AND STRUCTURES FORMED THEREFROM

CROSS-REFERENCE TO RELATED APPLICATIONS

This application is a division of application Ser. No. 11/504,256 filed Aug. 14, 2006 now U.S. Pat. No. 7,585,749.

FIELD OF THE INVENTION

The present invention is directed to methods of forming a layer of material on a supporting substrate and the structures formed by the methods and, in particular, methods of making a structure comprising at least one layer of amorphous material on a supporting substrate.

BACKGROUND OF THE INVENTION

In the field of micro-electronics, it may be desirable to reduce the electrical resistance of the layers of a substrate intended for making electronic components. This reduction in resistance may be obtained by increasing the concentration of the carriers.

Figure 1:
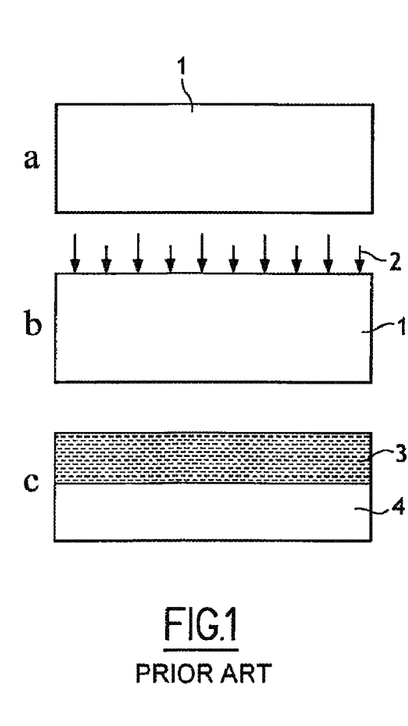

This increase in the concentration of carriers, the main steps of which are schematically illustrated in FIG. 1, is obtained in a conventional way by doping the substrate 1, illustrated in FIG. 1a. In silicon this may be accomplished by implanting a dopant species 2, with reference to FIG. 1b. The implantation is typically performed with dopant species such as, for example, phosphorous or boron. The substrate obtained according to such a known method, with reference to FIG. 1c, thus comprises an upper doped area 3 and a lower crystalline area 4.

However, the dopant species has limiting solubility which corresponds to the maximum concentration of the carriers, which may be produced in the supporting substrate. Thus, it would be advantageous to be able to dope the substrate beyond standard solubility limits of the order of 1e20 at/cm3. For this purpose, applying a so-called solid phase epitaxy (SPE) is also known, the main steps of which are schematically illustrated in FIG. 2.

Figure 2:
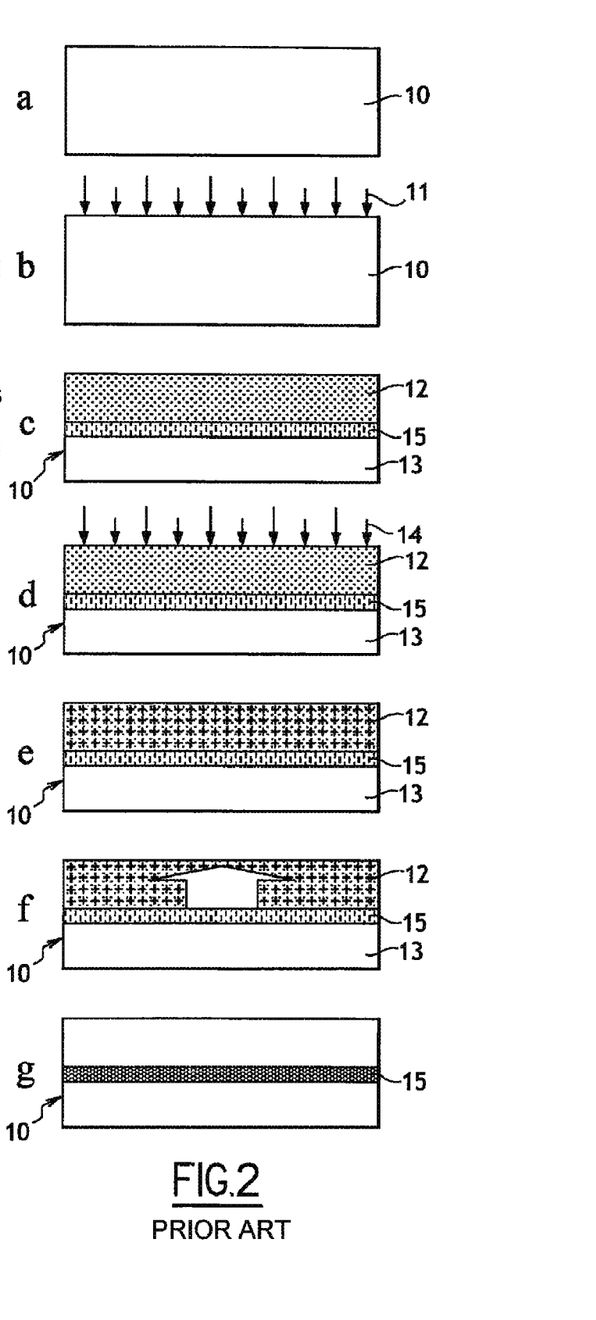

The solid phase epitaxy is illustrated in FIG. 2 for treating a supporting substrate 10 which is typically in silicon. During a first step (FIG. 2b), atomic species 11 such as silicon are implanted from the upper face of the supporting substrate in order to create an upper amorphous layer 12 in the supporting substrate 10, as illustrated in FIG. 2c. After implantation of atomic species, the substrate includes a lower crystalline layer 13 and an upper amorphous layer 12. It should be noted that this implantation of species 11 also generates a region 15 immediately underneath the amorphous layer 12 that contains a few atomic species (such as silicon) in interstitial positions without the structure of this region 15 being describable as amorphous. In a second optional step, with reference to FIGS. 2d and 2e, a doping species 14 such as phosphorous or boron is implanted in the amorphous layer 12.

Next, with reference to FIG. 2f, after the previous optional step for implanting a dopant species, low temperature recrystallization annealing is performed, the dopant species 14 implanted in the amorphous layer 12 being then activated so that the dopant species 14 is put in a substitutional position in the layer 12 in a large proportion.

By low temperature recrystallization annealing, is meant a heat treatment at a temperature between 550° C. and 650° C. which allows recrystallization of the amorphous layer 12 from the crystalline layer 13 of the substrate 10, this layer 13 playing a role of seed layer.

With such a technique, it is thereby possible to activate the dopants beyond their limiting solubility in the supporting substrate 10. It will be noted that, in the case of silicon, the limiting solubility of most current dopants varies between 1e18 and 1.5e20 at/cm3 for temperatures from 800° C. to 1,150° C. With this increase in the solubility of the dopants, the concentration of carriers in the supporting substrate 10 may be increased, thereby causing a lowering of the source/drain resistances of the electronic components made on the substrate and, consequently, low power consumption of the components.

This technique, however, is also associated with a drawback. End of range (EOR) type point defects are generated at the end of the recrystallization annealing, in the region 15 immediately located under the recrystallized layer 12. These EOR defects are caused by crystalline defects which appear during the amorphization step and which develop during the recrystallization step. The EOR defects considerably deteriorate electrical performances and more particularly the mobility of the carriers of the substrate 10 so that these substrates are unsuitable for making electronic components. Thus, the solid phase epitaxy type methods are associated with certain limitations, if the methods allow the limiting solubility of dopants to be increased in a substrate.

It is, therefore, desirable to have a method which would eliminate these limitations.

SUMMARY OF THE INVENTION

The invention relates to a method for making a structure that includes at least one layer on a supporting substrate which comprises:

forming an intermediate substrate from the supporting substrate, wherein the intermediate substrate has an upper face, an upper portion and a lower portion, and comprises an amorphous layer and a first crystalline layer containing end of range point defects subjacent the amorphous layer;

bonding a receiving substrate to the upper face of the intermediate structure; and removing the first crystalline layer of the intermediate structure so that the amorphous layer forms the upper layer of the intermediate structure upon the receiving substrate and the intermediate structure does not contain end of range point defects.

Advantageously, the intermediate substrate is formed with the amorphous layer immediately beneath and in contact with the first crystalline layer and a second crystalline layer is provided beneath the first crystalline layer. The intermediate substrate may be formed with an additional crystalline layer positioned in the upper portion above the amorphous layer.

Alternatively, the intermediate substrate is formed with the amorphous layer present in the upper portion and providing the upper face of the intermediate substrate. This amorphous layer may be formed by depositing an epitaxied crystalline layer on the supporting substrate followed by total or partial amorphization of the deposited layer. The amorphous layer is preferably formed by implanting species to a preselected depth in the supporting substrate.

The amorphous layer may be doped by implanting species through the upper face of the intermediate structure before bonding the receiving substrate to the upper face of the intermediate structure. The doping of the amorphous layer is preferably made by implanting at least one of boron or phosphorus. Thereafter, the dopants that are implanted in the amorphous layer may be activated by heat treating the intermediate structure under conditions sufficient to cause the amorphous layer to recrystallize. This heat treating is generally conducted at a temperature of between 550° C. and 650° C. for a time of one to two hours.

The method further comprises providing a weakened area in the intermediate structure beneath the first crystalline layer to define the lower portion of the intermediate structure; applying stresses to the weakened area to detach the lower portion of the intermediate structure from the remaining portion of the intermediate structure on the receiving substrate; and abrading the remaining portion of the intermediate structure until the first crystalline layer is removed. The weakened area may be provided by implanting at least one of ions or gaseous species through the upper layer of the intermediate structure or it may be a porous layer. The remaining portion of the intermediate structure is preferably abraded by chemical mechanical planarization.

The method also further comprises conducting a plasma activation step on at least one of the upper face of the intermediate structure or on the face of the receiving substrate prior to bonding the receiving substrate to the intermediate structure.

Another embodiment of the invention relates to a structure comprising at least one layer of an amorphous material on a central crystalline layer on a substrate, each of which lack any end of range point defects. The amorphous layer may be is doped with boron or phosphorus at a concentration of at least 1 e20 at/cm3. Finally, the doped amorphous layer may be recrystallized to form a crystalline layer that is free of end of range point defects.

BRIEF DESCRIPTION OF THE DRAWINGS

The present invention can be better understood by reference to the following drawings, wherein like references numerals represent like elements. The drawings are merely exemplary to illustrate certain features that may be used singularly or in combination with other features and the present invention should not be limited to the embodiments shown.

FIGS. 1a-1c is a schematic illustration of the steps of a method of doping a substrate according to the prior art;

FIGS. 2a-2g is a schematic illustration of the steps of a method for making a substrate according to the prior art;

FIGS. 3a-3i is a schematic illustration of the steps of an alternative exemplary method for making a substrate according to the invention;

FIGS. 4a-4i is a schematic illustration of the steps of another alternative exemplary method for making a substrate according to the invention;

FIGS. 5a-5j is a schematic illustration of the steps of yet another alternative exemplary method for making a substrate according to the invention;

FIGS. 6a-6j is a schematic illustration of the steps of an alternative exemplary method for making a substrate according to the invention;

DETAILED DESCRIPTION OF THE PREFERRED EMBODIMENTS

The present invention relates to a method for making a structure which may comprise at least one thin layer of an amorphous material obtained by solid phase epitaxy (SPE) on a supporting substrate. In a non-limiting example, the method may be used to make a semiconductor substrate, the upper layer of which is doped for forming, for example, CMOS (Complementary Metal Oxide SemiConductor) components such as transistors.

Figure 3:
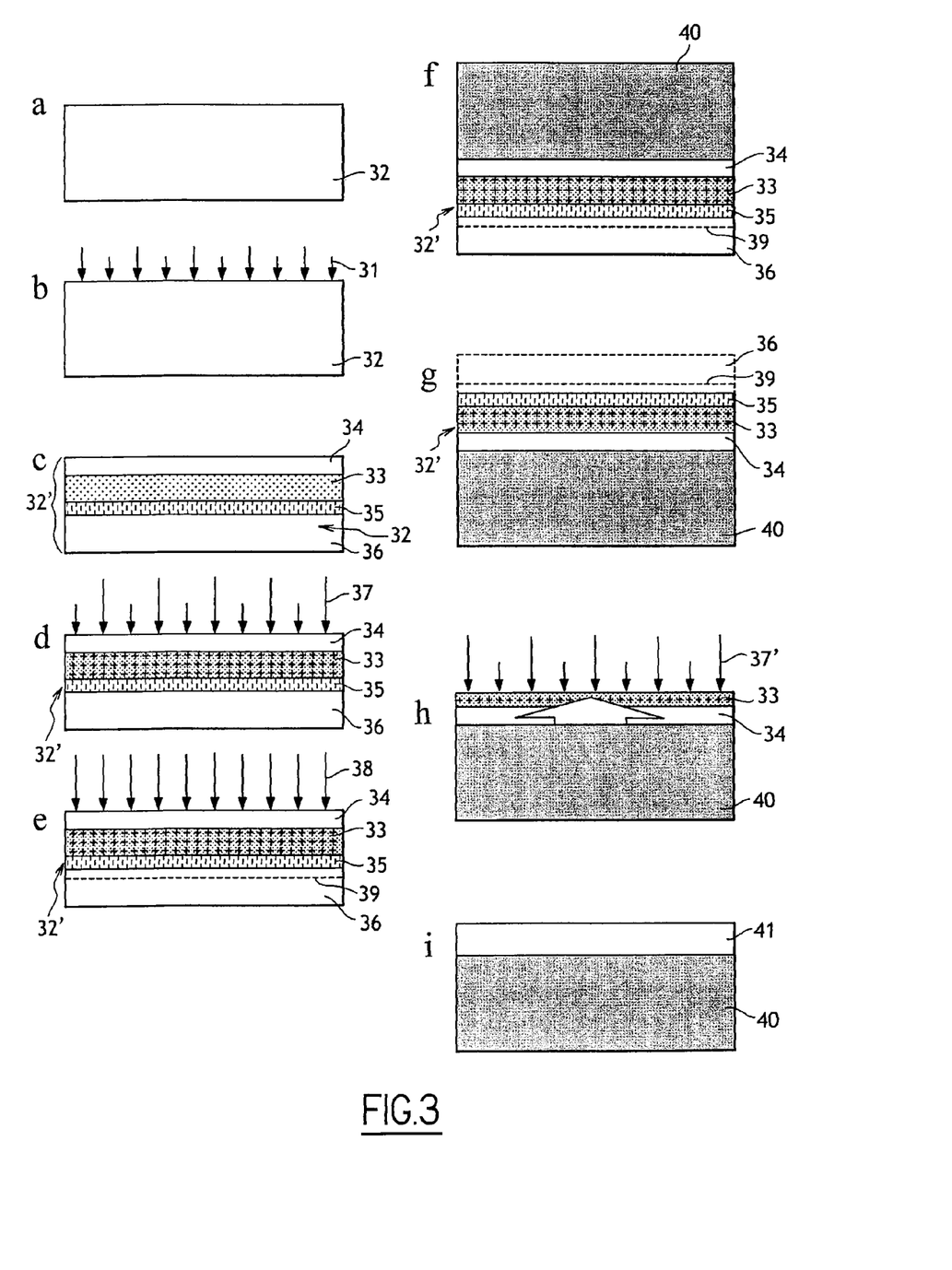

With reference to FIG. 3, according to one embodiment of the invention, the method includes a step for implanting species 31 (FIG. 3b) from the upper face of a substrate 32 (FIG. 3a) so as to form a buried amorphous layer 33 such as illustrated in FIG. 3c. In such an embodiment, point defects may be removed by implantation of a weakened zone followed by detachment at the appropriate point of the process as further described herein.

Substrate 32 for example may have a general disc shape which extends in a horizontal direction. The substrate 32 may be a semiconductor material such as, for example, silicon. Species 31 may be, for example, Si. In order to obtain a buried layer 33, the implantation parameters may be controlled in order to retain a region 34 at the surface of the substrate 32, the crystallinity of which is not changed by the implanted species 31.

After forming the buried amorphous layer 33, the supporting substrate 31 may have an intermediate structure 32', such as shown in FIG. 3c, which includes an upper layer 34 which has remained crystalline, a buried amorphous layer 33 located under the upper crystalline layer 34, a central crystalline layer 35 containing crystalline point defects located immediately underneath the buried amorphous layer 34, and a lower crystalline layer 36. The point defects subadjacent the amorphous layer of this intermediate structure, which also may be considered as an intermediate substrate, results from forming the buried amorphous layer. The point defects may be interstitial Si atoms, and may correspond to defects of the layer 15 of FIGS. 2c-2e. Interstitial Si atoms may cause point defects of the EOR type.

Optionally, with reference to FIG. 3d, dopant species 37 such as boron and/or phosphorus may be locally implanted or in the full plate in the amorphous layer 33 through the upper face of the intermediate structure 32'. Upper face may be the face which receives the first implantation of species 31 (i.e., the top of the substrate 32). Ions and/or gas species 38 may then be implanted through the upper face of the substrate according to the SMART-CUT® method as described in the publication, Silicon-On-Insulator Technology: Materials to VLSI, 2nd Edition of Jean Pierre Colinge by Kluwer Academic Publishers, pages 50 and 51. In this way, a buried weakened area 39 may be formed in the substrate as illustrated by the dotted lines in FIG. 3e.

Area 39 may be located near the point defects of the layer 35, formed during amorphization. This weakened area 39 may be formed in the layer 36, near the layer 35, and may allow a portion of the layer 36 to be detached. This weakening implantation step preferably applies an implantation (with hydrogen exclusively, helium exclusively, etc.) or a co-implantation with at least two different atomic species (e.g., hydrogen and helium), which are sequentially implanted. In one embodiment of co-implantation, helium may be implanted before hydrogen.

Parameters of the species implantation may be selected so as to form a weakened area 39 under the point defects 35 of intermediate structure 32'. However, the weakening implantation parameters may be selected in such a way that the weakened area 39 may located at the level of the point defects 35.

Referring now to FIG. 3f, a receiving substrate 40 may be bonded onto the upper crystalline layer 34 of the intermediate structure 32' by any appropriate means. Bonded may mean intimately contacting the receiving substrate 40 on the intermediate structure 32' in order to assemble the intermediate structure 32' and substrate 40. Bonding may be attained by, for example, (1) directly contacting a surface of the receiving substrate 40 in a semiconductor material, such as Si, with a surface of the intermediate structure 32'; (2) forming an amorphous material layer in order to make a connecting layer on a surface of the intermediate structure 32' and/or forming an amorphous material layer in order to make a second connecting layer on a surface of the receiving substrate 40 and contacting the surfaces of the respective connecting layers of the intermediate structure 32' and of the receiving substrate 40; (3) forming a bonding interface on the surface of at least the intermediate structure 32' and/or the receiving substrate 40; or (4) combining both of the latter methods. When bonding the receiving substrate 40 on the face of the intermediate structure 32', the method according to the invention includes a plasma activation step in order to enhance the bonding and allow transfer at a lower temperature if necessary.

With reference to FIG. 3g, the crystalline layer 36 of the intermediate structure 32' may be detached at the weakened area 39 according to the SMART-CUT® method disclosed herein, by heat treatment and/or applying stresses such as mechanical forces. Thereafter, the upper surface of the remaining crystalline layer of the intermediate structure 32' may be removed such as by being abraded or polished, for example, by means of a chemical mechanical planarization (CMP) type method, until the amorphous layer 33 forms the upper layer of the intermediate structure 32', thereby eliminating the area 35 rich in crystalline defects.

With reference to FIG. 3h, a first final substrate may be obtained, comprising a lower receiving substrate 40, a central crystalline layer 34 and an upper doped amorphous layer 33. Optionally, if the doping step has not yet been performed and if the goal is to obtain a final highly doped crystalline structure, dopant species 37' such as boron and/or phosphorus may be implanted directly into the amorphous layer 33.

By means of recrystallization annealing, performed after the step for doping the amorphous layer 33, either directly after forming the amorphous layer 33 or after obtaining the first final substrate, as shown in FIG. 3i, the amorphous layer 33 may recrystallize from the crystalline layer 34 which plays a role of seed layer. During this recrystallization annealing, the dopant species initially implanted in the amorphous layer 33 may be activated. This annealing for recrystallizing and activating the dopant species may comprises low temperature heat treatment performed between 550° C. and 650° C. for one to two hours. It will be observed that the recrystallization annealing may be performed without any formation of end-of-range (EOR) type point defects, the point defects having been eliminated during the previous CMP type abrasion step.

The resultant substrate, as illustrated in FIG. 3i, may comprises a lower receiving substrate 40, on the one hand, and an upper doped crystalline layer 41, on the other hand, which does not have any EOR type point defect and which may have a concentration of dopants larger than or equal to 1e20 at/cm3. Such a substrate may be able to receive CMOS components such as, for example, transistors. In this particular exemplary embodiment, the receiving substrate 40 may be bonded onto the upper face of the intermediate structure 32'.

Figure 4:
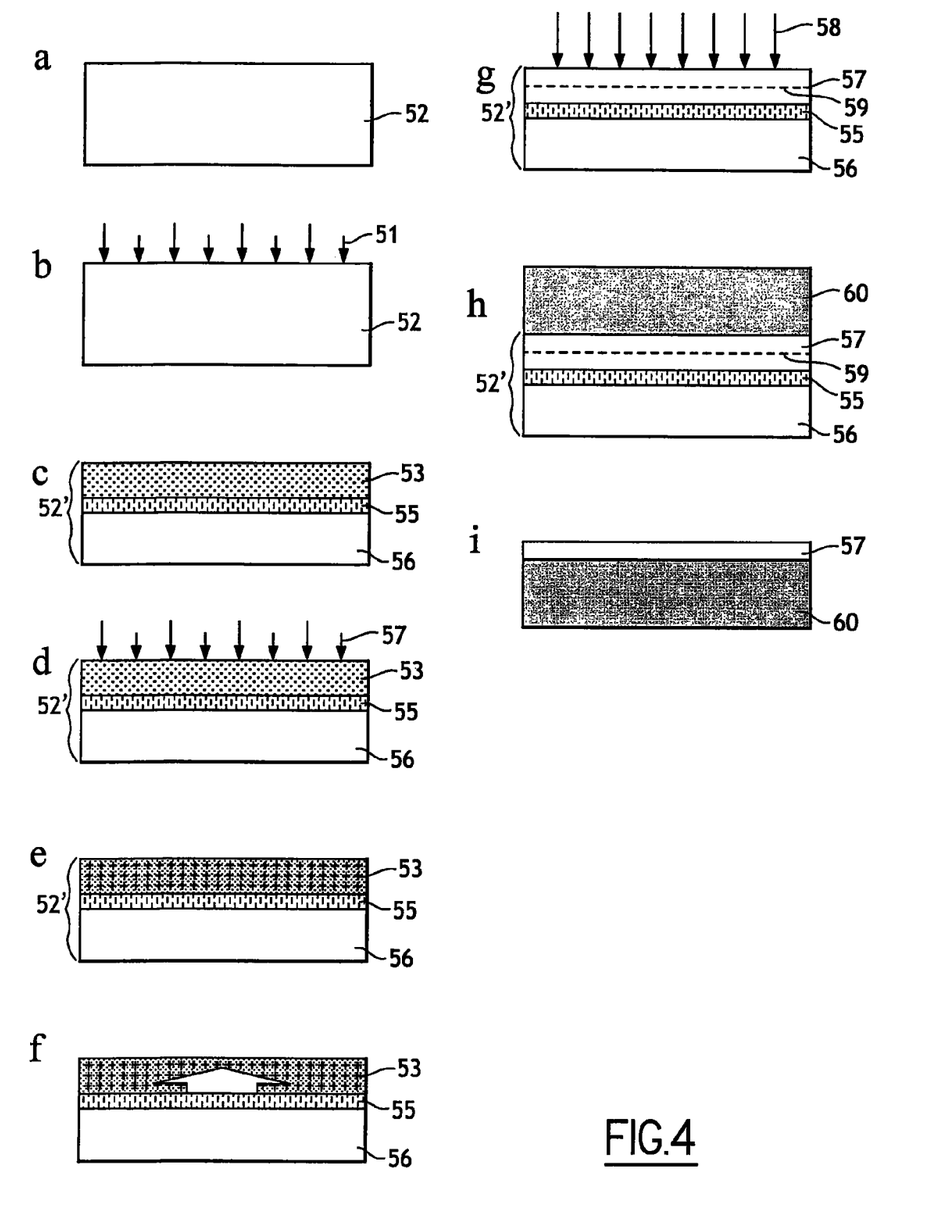

According to another embodiment of the invention, with reference to FIG. 4, the method includes a step for implanting species 51 (FIG. 4b) from the upper face of a substrate 20 (FIG. 4a) in order to form a surface amorphous layer 53, such as shown in FIG. 4c. The method may comprise removing point defects with weakening by implantation.

The substrate 52 may be a semiconductor material such as, for example, silicon. Moreover, the species 51 may be, for example, Si. In order to obtain a surface amorphous layer 53, the implantation parameters may be controlled in order to retain in depth a region 56, the crystallinity of which is not changed by the implanted species 51. It will be noted that the amorphous layer 53 may also be directly deposited on the substrate 52.

After forming the surface amorphous layer 53, the supporting substrate 52 may have an intermediate structure 52' which, as illustrated in FIG. 4c, may comprise an upper surface amorphous layer 53, a central crystalline layer 55 containing point defects and a lower crystalline layer 56. The point defects may be interstitial Si atoms and may correspond to the defects of layer 15 of FIGS. 2c-2e.

With reference to FIG. 4d, dopant species 57 such as boron and/or phosphorus, may be locally implanted or in the full plate in the surface amorphous layer 53 through the upper face of the atomic structure 52'. The intermediate structure 52' may then comprise an upper doped surface amorphous layer 53, a central crystalline layer 55 containing point defects, and a lower crystalline layer 56.

As shown in FIG. 4f, by recrystallization annealing the doped surface amorphous layer 53 may recrystallize from the crystalline layer 56 which plays the role of seed layer. During the recrystallization annealing, the dopant species initially implanted in the surface amorphous layer 53 may be activated. This annealing for recrystallizing and activating the dopant species may consists of a low temperature heat treatment performed between 550° C. and 650° C. for one to two hours.

As illustrated in FIG. 4g, the substrate obtained may comprise an upper doped crystalline layer 57, a central crystalline layer 55 containing point defects and a lower crystalline layer 56. Ions and/or gas species 58 may then be implanted through the upper face of the substrate according to the SMART-CUT® method described herein. In this way, a buried weakened area 59 may be formed in the substrate in the doped crystalline layer 57 as illustrated in dotted lines in FIG. 4g.

The area 59 may be located near the point defects of the layer 55, formed during amorphization. This weakened area 59 may be formed in the layer 57, near the layer 55 and may allow the portion of the layer 56 to be detached This weakening implantation step preferably applies an implantation (with hydrogen exclusively, helium exclusively, etc.) or a co-implantation with at least two different atomic species (e.g., hydrogen and helium), which are sequentially implanted. In one embodiment of co-implantation, helium may be implanted before hydrogen.

It will be observed that in this example, the parameters of the species implantation may be selected so as to form a weakened area 59 above the point defects 55 of the intermediate structure 52'. With reference to FIG. 4h, a receiving substrate 60 may be bonded onto the upper doped crystalline layer 57 of the intermediate structure 52' by any appropriate means. With reference to FIG. 4i, the crystalline layer 56 and the layer 55 containing the point defects of the intermediate structure 52' may be detached at the weakened area 59 according to the SMART-CUT® method disclosed herein, by heat treatment and/or applying stresses. Thereafter, a finishing treatment may be applied to the upper face of the doped crystalline layer 57. With reference to FIG. 4i, a final substrate consisting of a lower receiving substrate 60 and an upper doped crystalline layer 57 may be obtained.

It will be noted that, in this alternative embodiment of the method, which allows a substrate to be formed by direct silicon bonding (DSB) including a highly doped area without any EOR, recrystallization of the amorphous layer 53 may be performed before transfer onto the receiving substrate 60. This method is unlike the previous alternative embodiment in which recrystallization of the amorphous layer may be performed after the transfer where accurate control of the heat treatments may be needed in order to avoid performing heat treatments at too high of temperatures before SPE for activating the doping. Thus, it will be observed that in this new alternative embodiment, a heat balance which is too high should not be applied. In one preferred embodiment, a heat balance less than 400-500° C. may be used because the activated substrate remains in a metastable state. Moreover, in this alternative embodiment, an insulating layer may also be provided for bonding.

Figure 5:
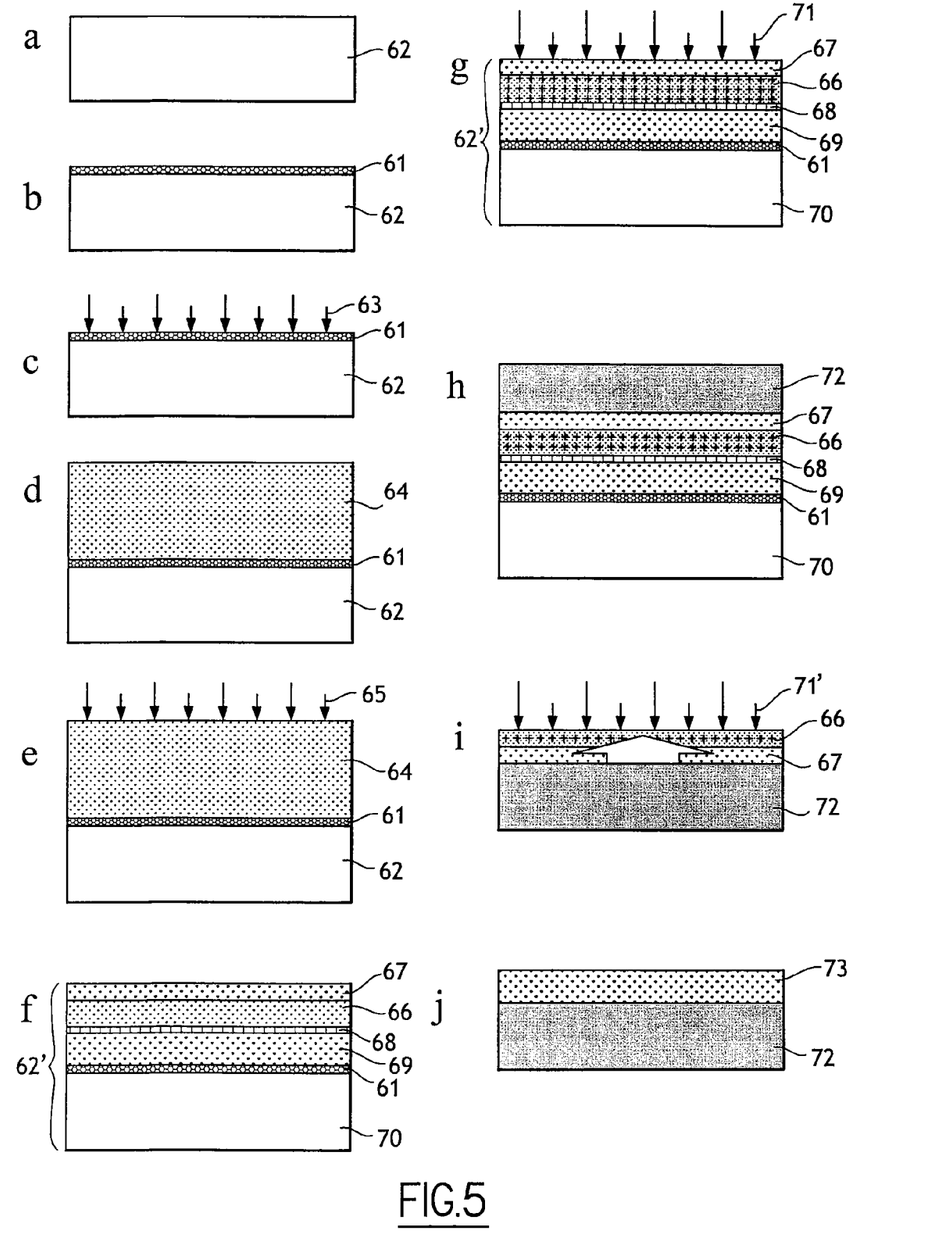

According to a third embodiment of the invention as illustrated in FIG. 5, the method includes a step for forming a weakened porous layer 61 (FIG. 5b) on a substrate 62 (FIG. 5a) obtained in a semiconductor material such as silicon. Such a method may comprise the formation of a buried amorphous layer and the removal of point defects with formation of a porous layer.

With reference to FIGS. 5c and 5d, an upper crystalline layer 64 may be deposited by epitaxy 63 on the weakened porous layer 62. The method then includes a step for implanting species 65 (FIG. 5e) from the upper face of the crystalline layer 64 so as to form a buried amorphous layer 66 such as shown in FIG. 5f. Species 65 may be, for example, Si. In order to obtain a buried layer 66, the implantation parameters may be controlled so as to retain at the surface of the substrate, a region 67 which substantially does not receive any species 65.

After forming the buried amorphous layer 66, the substrate may have an intermediate structure 62' such as shown in FIG. 5f which may comprise an upper layer 67 which has remained crystalline, a buried amorphous layer 66 positioned underneath the upper crystalline layer 67, a central crystalline layer 68 containing point defects, a first lower crystalline layer 69, a weakened porous layer 61 and a second lower crystalline layer 70. Optionally, with reference to FIG. 5g, the dopant species 71 such as boron and/or phosphorus, may be locally implanted or in the full plate in the amorphous layer 66 through the upper face of the intermediate structure 62'. The amorphous layer 66 may thereby be doped.

With reference to FIG. 5h, a receiving substrate 72 may then be bonded onto the upper crystalline layer 67 of the intermediate structure 62' by any appropriate means. With reference to FIG. 5i, the crystalline layer 69 of the intermediate structure 62' may be detached at the area of the porous layer 61 by applying stresses.

The upper surface of the remaining crystalline layer 69 of the intermediate structure 62' may then be removed, such as by being abraded, for example, by a chemical mechanical planarization (CMP) type method until the doped amorphous layer 66 forms the upper layer of the intermediate structure 62' (FIG. 5i). Optionally, if the doping step has not yet been performed and if the goal is to obtain a final highly doped crystalline structure, dopant species 71' such as boron and/or phosphorus, may be implanted in the amorphous layer 66 such as shown in FIG. 5i, thereby eliminating the area 68 rich in point defects.

By recrystallization annealing, as shown in FIG. 5i, the doped amorphous layer 66 may recrystallize from the crystalline layer 67 which plays the role of seed layer. During this recrystallization annealing, the dopant species initially implanted in the amorphous layer 66 may be activated. This annealing for recrystallizing and activating dopant species may involve a low temperature heat treatment performed between 550° C. and 650° C. for one to two hours. It will be observed that this recrystallization annealing may be performed without any formation of end-of-range type point defects. The crystalline point defects causing the EOR defects may have been eliminated during the abrasion step previously performed.

As illustrated in FIG. 5j, the resultant substrate may comprise a lower receiving substrate 72 and an upper doped crystalline layer 73, and may be able to receive CMOS components such as, for example, transistors.

Figure 6:
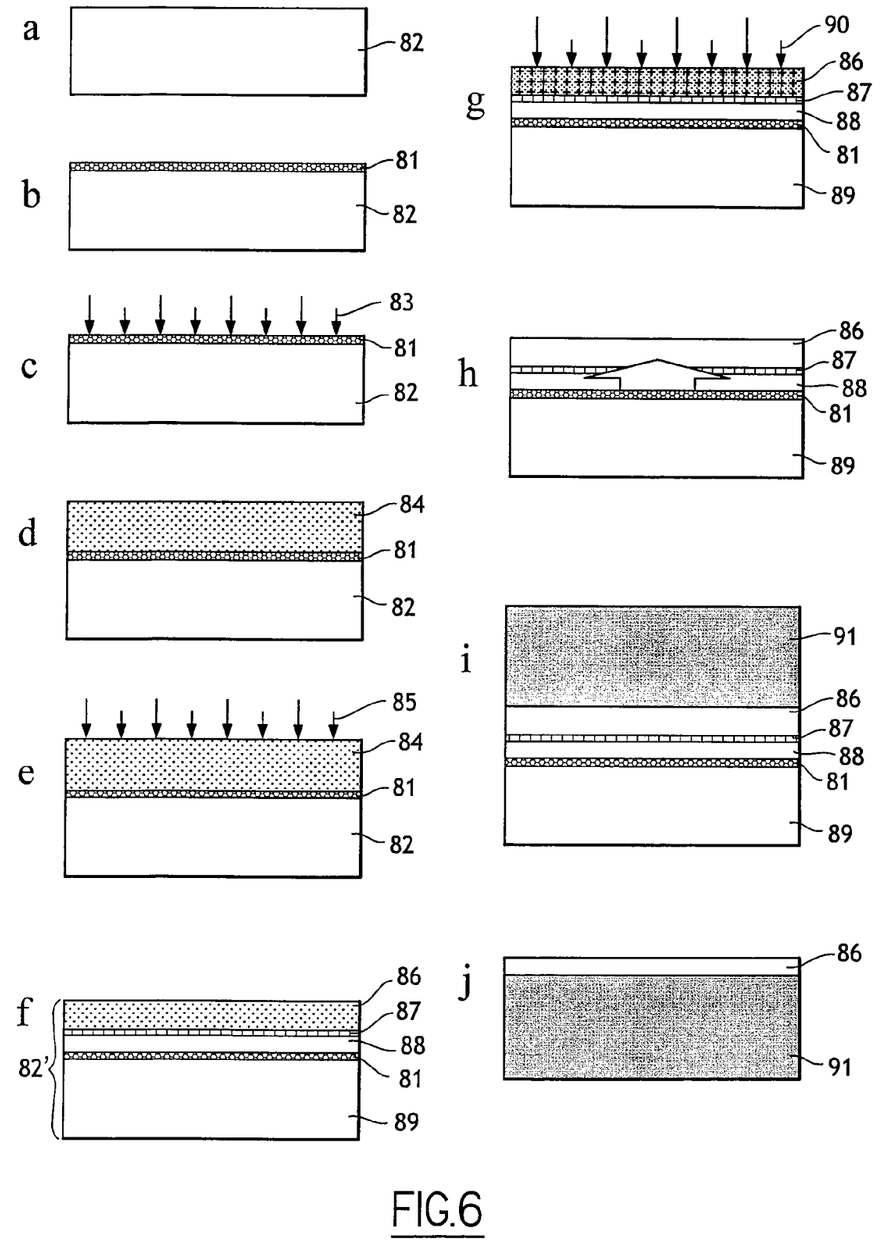

According to another embodiment, with reference to FIG. 6, the method includes a step of forming a weakened porous layer 81 (FIG. 6b) on a substrate 82 (FIG. 6a) obtained in a semiconductor material such as silicon. This method may comprise forming a surface amorphous layer and removing point defects with formation of a porous layer. With reference to FIGS. 6c and 6d, an upper crystalline layer 84 may be deposited by epitaxy 83 on the weakened porous layer 81. The method may also include a step for implanting species 85 (FIG. 6c) from the upper face of the crystalline layer 84 in order to form a surface amorphous layer 86 as illustrated in FIG. 6f. Species 85 may be, for example, Si.

In order to obtain a surface amorphous layer 86, the implantation parameters may be controlled in a way known to one skilled in the art. It will be observed that the amorphous surface layer 86 may also be made by directly depositing an amorphous layer.

After forming the surface amorphous layer 86, the substrate may have an intermediate structure 82', such as shown in FIG. 6f. The intermediate structure 82' may have an upper surface amorphous layer 86, a central crystalline layer 87 containing point defects, a first crystalline layer 88, a buried crystalline layer, a weakened porous layer 81 positioned underneath the buried crystalline layer 88 and a second or lower crystalline layer 89. Alternatively, with reference to FIG. 6g, dopant species 90 such as boron and/or phosphorus, may be locally implanted or in the full plate in the surface amorphous layer 86 through the upper face of the intermediate structure 82'. The surface amorphous layer 86 may thereby be doped.

By recrystallization annealing, as shown in FIG. 6h, the doped surface amorphous layer 86 will recrystallize from the crystalline layer 88 which plays the role of seed layer. During this recrystallization annealing, the dopant species initially implanted in the surface amorphous layer 86 may be activated. This annealing for recrystallizing and activating dopant species may involve a low temperature heat treatment performed between 550° C. and 650° C. for one to two hours. The resultant substrate as illustrated in FIG. 6h may comprise an upper doped crystalline layer capable of receiving CMOS components such as, for example, transistors, a central crystalline layer 87 containing EOR type point defects, a first crystalline layer 88, a buried crystalline layer, a weakened porous layer 81 positioned underneath the buried crystalline layer 88 and a second or lower crystalline layer 89.

With reference to FIG. 6i, a receiving substrate 91 may be bonded onto the upper doped crystalline layer 86 of the intermediate structure 82' by any appropriate means know in the art. The lower crystalline layer 89 may be detached at the weakened porous layer 81 by applying stresses. Thereafter, the upper surface of the remaining crystalline layer 88 of the intermediate structure 82' may be removed such as by being abraded, for example, by a chemical mechanical planarization (CMP) type method until the doped crystalline layer 86 forms the upper layer of the intermediate structure 82' (FIG. 6j). In this way, the EOR defects present within the layer 87 may be eliminated. The resultant substrate illustrated in FIG. 6j, which may comprise a lower receiving substrate 91 and an upper doped crystalline layer 86, may be capable of receiving CMOS components such as, for example, transistors. Alternatively, the upper face of the doped crystalline layer 86 may be treated for finishing.

A particular but non-limiting exemplary embodiment of a substrate obtained according to the invention will be described hereafter with reference to FIG. 3. With reference to FIG. 3, the method for making a structure includes a step for implanting species 31 such as silicon (FIG. 3b) from the upper face of a substrate 32 (FIG. 3a) (obtained in a semiconductor material such as silicon) in order to form a buried amorphous layer 33 as shown in FIG. 3c. In order to obtain a buried amorphous layer 33, the implantation parameters may be controlled in order to retain a region 34 at the surface of the substrate 32. The characteristics of the buried amorphous layer (e.g., depth and width) may be adjustable according to the dose and implantation energy. After selecting the isoelectric species of the silicon to be implanted in the Si substrate to amorphize the silicon (Ge, Sn or Si), the energy and dose may be selected. Below is an exemplary protocol with which these characteristics (e.g., depth and width) may be established.

A commonly used model is that of the critical energy density as proposed by Stein and Vook E. P. EerNisse; Investigation of Ion Implantation Damage with Stress, Proc. 1st INT. Conf. On Ion Implantation, Gordon and Breach, London, 17 (1971). When a critical concentration of point defects is reached, the crystal spontaneously transits to the amorphous state. The defect concentration is related to the nuclear energy density received by the target. A critical value of the deposited damage energy density in nuclear collisions (Edc) is associated with the critical concentration of the defects. As a result, if the critical value is reached, the crystal/amorphous transition occurs. From this model, it is possible to infer the depth x at which the crystal/amorphous interface is located by means of the following relationship:

$$Dose \cdot Ed(x) = Edc.$$

The critical energy density Edc is a widely investigated experimental parameter for amorphization of Si by implanting Si+, Ge+ or Sn+ ions. For example, in the case of germanium, this value is 2 eV/at. From simulations by means of commercial computers such as FLOOPS® or LUPIN®, it is possible to obtain the damage energy distribution per incident ion at depth x (Ed(x)). For a given implantation energy, it is then possible to localize in depth the amorphous area by plotting the curve [Dose·Ed(x)] versus the depth x.

Figure 7:
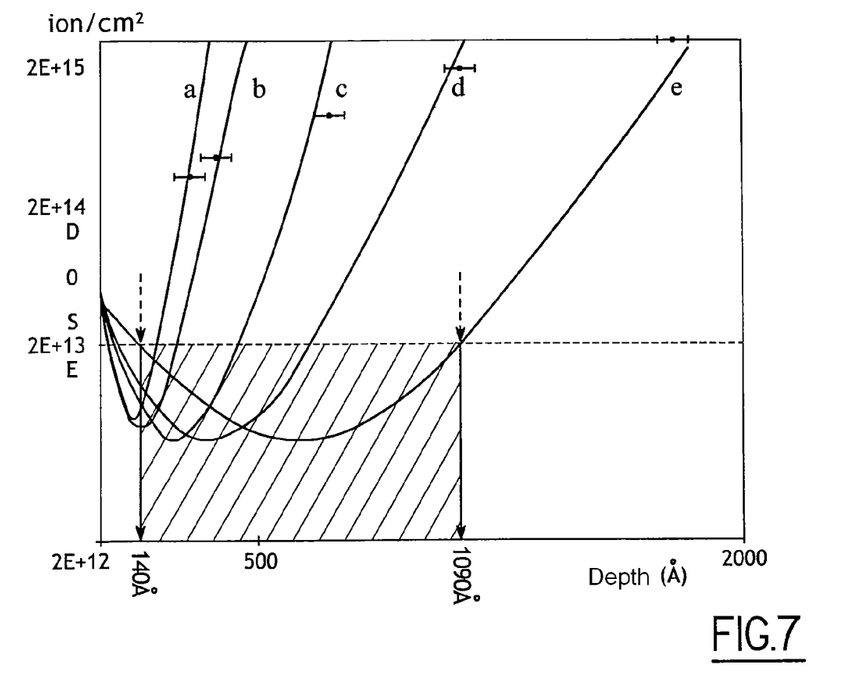
FIG. 7 is an exemplary dose/depth diagram of SiGe systems for different implantation energies.

The graph of FIG. 7 gives an example of curves for the case of a Ge implantation at 15 keV (curve a), 25 keV (curve b), 50 keV (curve c), 80 keV (curve d), and 150 keV (curve e) in a Si substrate. The critical damage energy is taken to be the standard value of 2 eV/at. By means of these curves, it is then possible to provide the characteristics of the amorphous layers. At a given energy, for example, 15 keV, according to the dose of implanted Ge, the amorphous layer will be buried or will open onto the surface. In order that it should be buried as in the invention, the implantation dose needs to remain lower than the first value at abscissa x=0 of the curve corresponding to the selected implantation energy. For example, in the case of implantation of Ge+ at 150 keV (curve e) in Si, the implantation dose needs to be less than 5e13 at/cm-2 so that the layer is buried. Thus, with a dose of 3e13 at/cm-2, an amorphous layer is obtained which starts at about 140 Å under the surface and ends at a depth of 1090 Å (i.e., an amorphous layer thickness of about 950 Å). The crystalline structure is therefore retained over the first 140 Angstroms. This crystal film will serve as a seed for subsequent rebuilding of the amorphous layer.

After forming the buried amorphous layer 33, the supporting substrate 32 has a so-called intermediate structure 32', such as shown in FIG. 3c, comprising an upper layer 34 which has remained crystalline, a buried amorphous layer 33 positioned under the upper crystalline layer 34, a central crystalline layer 35 containing point defects and a lower crystalline layer 36. The point defects are interstitial Si atoms; which correspond to defects of the layer 15 of FIGS. 2c-2e.

With reference to FIG. 3d, dopant species 37 such as boron and/or phosphorus may be locally implanted or in the full plate in the amorphous layer 33 through the upper face of the intermediate structure 32'. Ions and/or gas species 38 may then implanted through the upper face of the substrate according to the SMART-CUT® method described herein, thereby forming a buried weakened area 39 in the substrate, illustrated in dotted lines in FIG. 3e.

The area 39 may be located near the point defects of the layer 35 formed during amorphization. This weakened area 39 may be formed in the layer 36, near the layer 35 and may allow the portion of the layer 36 to be detached. This weakening implantation step preferably applies an implantation (with hydrogen exclusively, helium exclusively) or a co-implantation of at least two different atomic species. For example, hydrogen and helium may be sequentially implanted, helium being preferably implanted before hydrogen.

Figure 8:
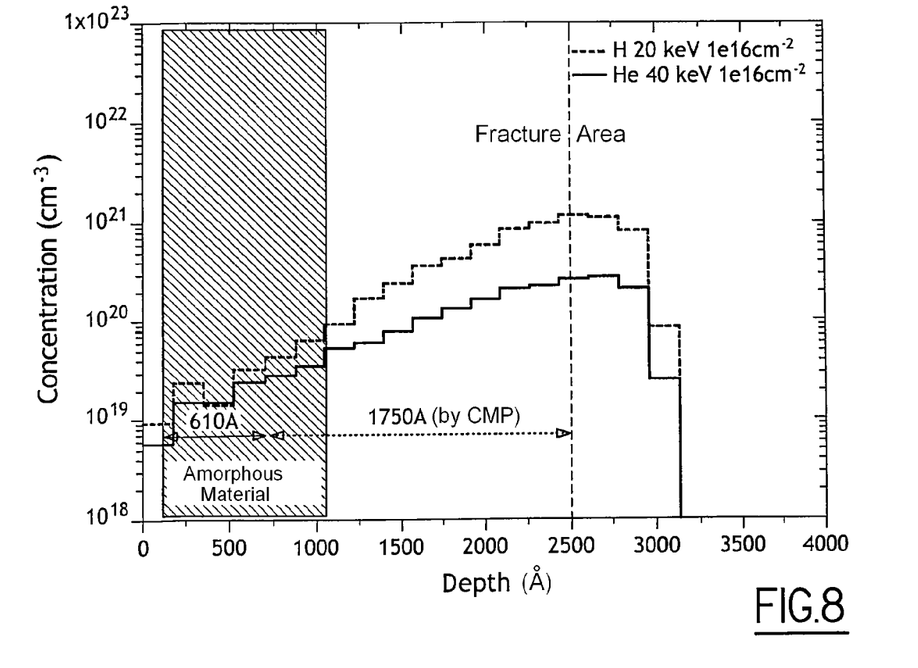
FIG. 8 is a graph illustrating exemplary concentrations of implanted species versus the depth in the substrate.

Implantation of hydrogen and helium may be adjusted in order to position the concentration maxima beyond 1090 Å in the above example. Hydrogen may be implanted, for example, at 25 keV with a dose of 1e16 cm-2 such that the concentration may be positioned at a maximum at about a depth of 2500 Å (i.e., 1410 Å beyond the second amorphous/crystal interface as shown in FIG. 8). Helium may be implanted at about 40 keV and 1e16 cm-2 which positions the concentration maximum at a depth of about 2750 Å (i.e., 250 Å beyond the concentration maximum of the first hydrogen implantation). Fracture of the material will occur in the fracture area illustrated in dotted lines on the graph of FIG. 8 approximately at the concentration maximum of hydrogen (i.e., at about 2500 Å under the surface).

With reference to FIG. 3f, a receiving substrate 40 may then be bonded onto the upper crystalline layer 34 of the intermediate structure 32' by any appropriate means known in the art. As shown in FIG. 3g, the crystalline layer 36 of the intermediate structure 32' may then be detached at the weakened area 39 according to the SMART-CUT® method disclosed herein, by heat treatment and/or applying stresses. Thereafter, the upper surface of the remaining crystalline layer of the intermediate structure 32' may be removed such as by being abraded, for example, by means of a chemical mechanical planarization (CMP) type method. Abrading may continue until the amorphous layer 33 forms the upper layer of the intermediate structure 32' thereby eliminating the area 35 rich in point defects. The abrasion step consists in a well-known mechano chemical polishing called CMP, of the present state of the art, in order to remove 1750 Å of silicon according to the graph of FIG. 8. As shown in FIG. 3h, a first final substrate is obtained and may comprise a lower receiving substrate 40, a central crystalline layer 34 with a thickness of 140 Å and an upper doped amorphous layer 33 with a thickness of 610 Å.

By recrystallization annealing, performed after the step for doping the amorphous layer 33, either immediately after the formation of the amorphous layer 33 or after obtaining the first final substrate, as shown in FIG. 3i, the amorphous layer 33 will recrystallize from the crystalline layer 34. The crystalline layer 34 plays the role of seed layer. During this recrystallization annealing, the dopant species initially implanted in the amorphous layer 33 will be activated. This annealing for recrystallizing and activating dopant species may consist of a low temperature heat treatment performed between 550° C. and 650° C. for one to two hours. As illustrated in FIG. 3i, the resultant substrate comprises a lower receiving substrate 40 and an upper doped crystalline layer 41 with a thickness of 140 Å.

The examples above illustrate embodiments in which removal of the layer of the intermediate structure (in which point defects have formed) is performed by detachment at a weakened area which has been formed in the intermediate structure. However, these examples are not limiting and it is also possible to perform such a removal by etching the rear face of the intermediate structure after bonding (in order to remove a controlled thickness thereof, for example, by etching or polishing) or by any other known form of mechanical and/or chemical etching. Finally, all the layer transfer parameters may be contemplated notably depending on the nature of the implanted species, the implantation energy, and the implantation dose. The examples described above are not meant to be limiting as to the fields of application of the invention.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of structure, arrangement, proportions, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims, and not limited to the foregoing description.

What is claimed is:

1. A structure comprising at least one layer of an amorphous material on a central crystalline layer of a substrate, a supporting structure bonded to the layer of amorphous material, and a weakened or porous layer positioned to facilitate the removal of the first crystalline layer, wherein the amorphous material lacks any end of range point defects.

2. The substrate of claim 1, wherein the central crystalline layer is also free of end of range point defects.

3. The substrate of claim 1, wherein the amorphous layer is a doped amorphous layer that includes boron or phosphorus dopants at a concentration of at least 1 e 20 at/cm 3.

4. The substrate of claim 3, wherein the doped amorphous layer is in the form of a crystalline layer that is free of end of range point defects.

5. The substrate of claim 1, wherein the amorphous layer comprises a semiconductor material.

6. The substrate of claim 1, wherein the central crystalline layer comprises a first crystalline layer containing end of range point defects which is subjacent the amorphous layer.

7. The substrate of claim 6, wherein the first crystalline layer and amorphous layer are present in an intermediate substrate having an upper face, an upper portion and a lower portion, with the first crystalline layer located in the lower portion of the intermediate substrate.

8. The substrate of claim 7, wherein a weakened layer is present and the weakened layer is formed by implantation of hydrogen ions, helium ions, or both hydrogen and helium ions so that, if desired, the first crystalline layer of the intermediate substrate can be removed to provide the amorphous layer as an exposed layer.

9. The substrate of claim 7, wherein the intermediate substrate includes a second crystalline layer beneath the first crystalline layer.

10. The substrate of claim 7, wherein the amorphous layer comprises a semiconductor material.

11. The substrate of claim 7, wherein the intermediate substrate includes a third crystalline layer positioned in the upper portion above the amorphous layer.

12. The substrate of claim 7, wherein the amorphous layer is doped amorphous layer that includes boron or phosphorus dopants at a concentration of at least 1 e20 at/cm3.

13. The substrate of claim 7, which further comprises a weakened or porous layer positioned to facilitate the removal of the first crystalline layer.

14. A structure comprising an intermediate substrate that includes at least one layer of an amorphous material upon a central crystalline layer, wherein the central crystalline layer contains end of range point defects and the layer of amorphous material lacks any end of range point defects, and a supporting substrate bonded to the layer of amorphous material of the intermediate substrate, wherein, if desired, the central crystalline layer of the intermediate substrate can be removed to provide the amorphous layer as an exposed layer of the structure.

15. The substrate of claim 14, wherein the central crystalline layer comprises a first crystalline layer containing end of range point defects which is subjacent the amorphous layer in the substrate and a second crystalline layer beneath the first crystalline layer.

16. The substrate of claim 14, wherein the intermediate substrate includes a third crystalline layer positioned in the upper portion above the amorphous layer.

17. The substrate of claim 14, wherein the intermediate substrate includes a third crystalline layer positioned in the upper portion above the amorphous layer.

18. The substrate of claim 14, which further comprises a weakened or porous layer positioned to facilitate the removal of the central crystalline layer.

* * * * *